United States Patent
Misaki et al.

(10) Patent No.: US 9,170,283 B2
(45) Date of Patent: Oct. 27, 2015

(54) CURRENT DETECTOR

(75) Inventors: Takashi Misaki, Yokkaichi (JP); Kouji Nishi, Yokkaichi (JP); Hirokatsu Nakajima, Yokkaichi (JP); Susumu Fukuyama, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 56 days.

(21) Appl. No.: 14/118,146

(22) PCT Filed: Apr. 5, 2012

(86) PCT No.: PCT/JP2012/059369
§ 371 (c)(1),
(2), (4) Date: Nov. 15, 2013

(87) PCT Pub. No.: WO2012/157362
PCT Pub. Date: Nov. 22, 2012

(65) Prior Publication Data
US 2014/0091788 A1 Apr. 3, 2014

(30) Foreign Application Priority Data
May 18, 2011 (JP) ................. 2011-111178

(51) Int. Cl.
*G01R 33/04* (2006.01)
*G01R 33/07* (2006.01)
*G01R 19/00* (2006.01)
(Continued)

(52) U.S. Cl.
CPC .............. *G01R 19/0092* (2013.01); *G01R 3/00* (2013.01); *G01R 15/202* (2013.01); *G01R 15/207* (2013.01); *Y10T 29/49117* (2013.01)

(58) Field of Classification Search
CPC ....................................... G01R 33/04
USPC ........................................ 324/253
See application file for complete search history.

(56) References Cited

U.S. PATENT DOCUMENTS

| 6,008,634 A | 12/1999 | Murofushi et al. |
| 6,252,389 B1 * | 6/2001 | Baba et al. ................. 324/117 H |
| 6,452,767 B1 * | 9/2002 | Brooks ........................... 361/42 |

(Continued)

FOREIGN PATENT DOCUMENTS

| JP | 10-104279 | 4/1998 |
| JP | A-2002-243768 | 8/2002 |

(Continued)

*Primary Examiner* — Bot Ledynh
(74) *Attorney, Agent, or Firm* — Oliff PLC

(57) ABSTRACT

A current detector includes a magnetic core that is molded by sintering powder made from a magnetic material, and a current detection busbar. The current detection busbar is a conductor including a penetrating portion that penetrates a hole portion of the magnetic core in a first direction in which a current flows, and terminal portions that are in connection with the penetrating portion on both sides in the first direction. The width of the terminal portions is larger than the maximum width of the hole portion, and the minimum width of the cross-sectional contour of the penetrating portion is larger than the thickness of the terminal portions. An insulating casing holds the magnetic core, the current detection busbar, and the Hall element, while keeping them from coming into contact with each other.

10 Claims, 10 Drawing Sheets

(51) Int. Cl.
   *G01R 15/20* (2006.01)
   *G01R 3/00* (2006.01)

(56) References Cited

U.S. PATENT DOCUMENTS

| | | | |
|---|---|---|---|
| 2004/0080308 A1* | 4/2004 | Goto | 324/117 H |
| 2004/0252501 A1* | 12/2004 | Moriyama et al. | 362/238 |
| 2006/0119343 A1 | 6/2006 | Saito et al. | |
| 2009/0058412 A1* | 3/2009 | Taylor et al. | 324/252 |
| 2010/0328013 A1* | 12/2010 | Kim et al. | 336/221 |
| 2011/0068771 A1* | 3/2011 | Ueno et al. | 324/117 R |
| 2012/0206225 A1 | 8/2012 | Misaki | |
| 2012/0212220 A1 | 8/2012 | Fukuyama | |

FOREIGN PATENT DOCUMENTS

| | | |
|---|---|---|
| JP | A-2003-045231 | 2/2003 |
| JP | A-2006-078255 | 3/2006 |
| JP | A-2006-166528 | 6/2006 |
| JP | A-2009-058451 | 3/2009 |
| JP | A-2012-042412 | 3/2012 |
| JP | A-2012-047564 | 3/2012 |
| WO | WO 2011/049161 | 4/2011 |
| WO | WO 2011/055811 | 5/2011 |

* cited by examiner

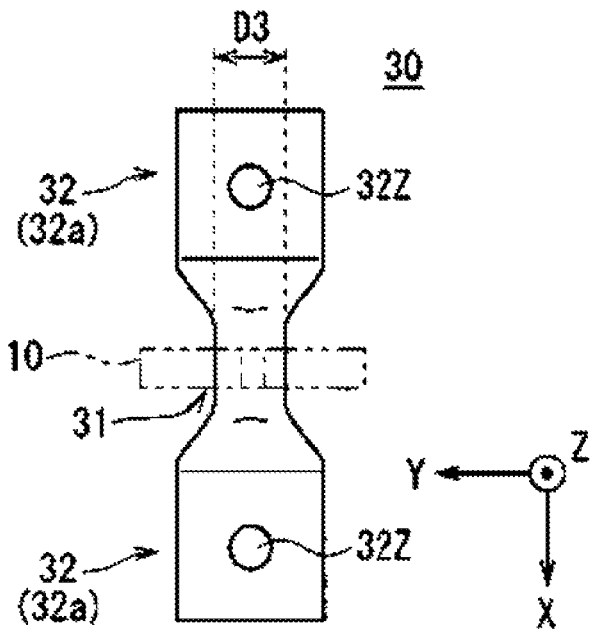
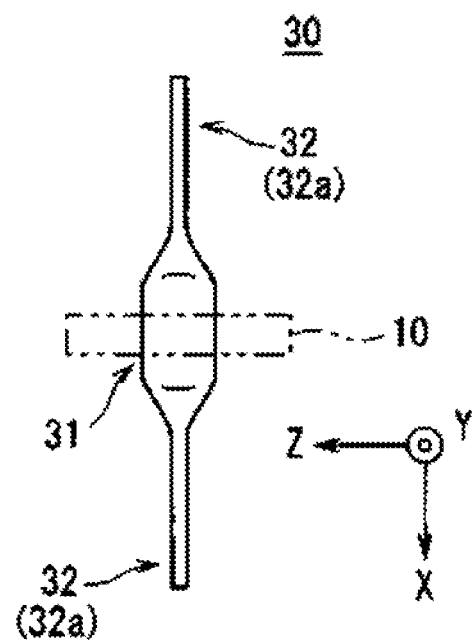
FIG. 2A  FIG. 2B
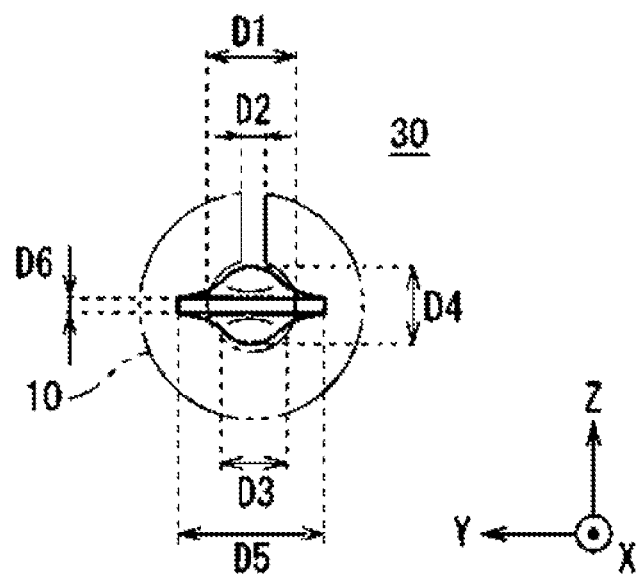
FIG. 2C

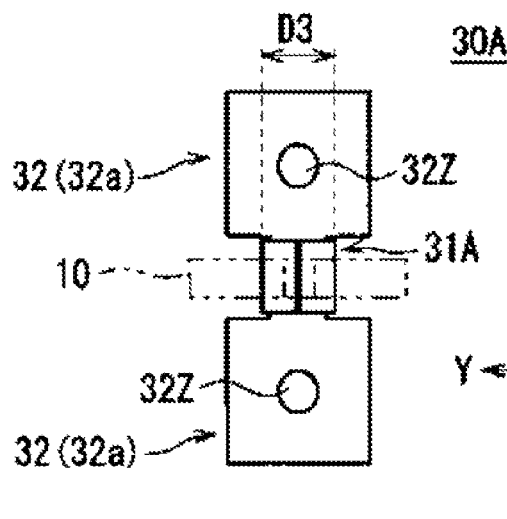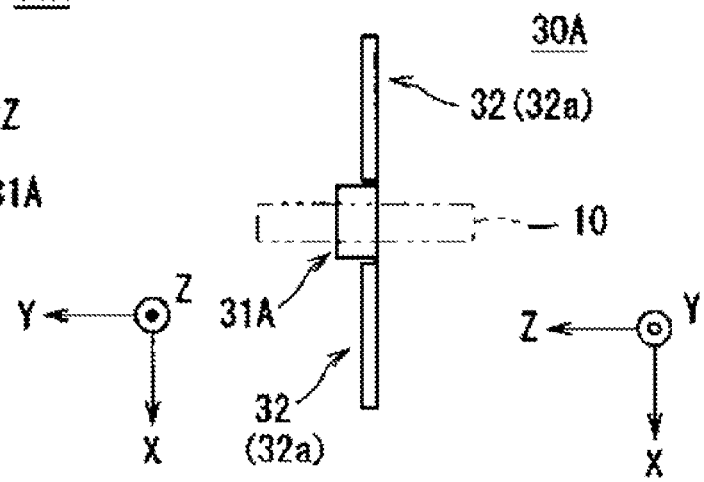
FIG. 6A  FIG. 6B
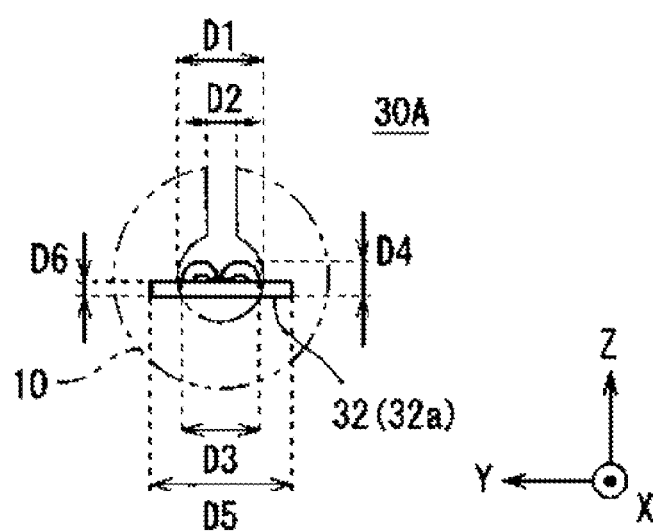
FIG. 6C

CURRENT DETECTOR

BACKGROUND

Vehicles such as hybrid automobiles or electric automobiles in many cases include a current detector for detecting a current that flows through a busbar connected to a battery. Examples of apparatuses that may be applied as such a current detector include a magnetic proportion-type current detector and a magnetic balance-type current detector.

A current detector of a magnetic proportion type or a magnetic balance type includes a magnetic core and a magneto-electric conversion element, for example, as shown in Japanese Pub. Patent Apps. H10-104279, 2006-166528A, and 2009-58451-A. The magnetic core is a magnetic material substantially in the shape of a ring with a gap portion, resulting in two ends facing each other across the gap portion. The magnetic core is formed in one piece so as to surround a hole portion penetrated by a busbar. The hole portion of the magnetic material is a space (current detection space) through which a current that is to be detected flows.

In the conventional current detector, the magnetic core has a structure obtained by a plurality of thin plate-like members that each have substantially the shape of a ring and are made from a magnetic material being stacked on top of each other via an adhesive agent. Hereinafter, the magnetic core having such a structure is referred to as a stacked-type magnetic core.

Furthermore, the magneto-electric conversion element is disposed in the gap portion of the magnetic core. The magneto-electric conversion element detects a magnetic flux that changes in accordance with a current that flows through the busbar penetrating through the hole portion, and then outputs a detection signal of the magnetic flux as an electrical signal. Typically, a Hall element is used as the magneto-electric conversion element.

SUMMARY

In a conventional current detector, since a flat plate-like busbar is inserted into a hole portion of a magnetic core, the magnetic core needs to be configured such that the maximum width (diameter) of the hole portion is larger than the width of the busbar. However, electric automobiles, hybrid automobiles and the like increasingly employ a wide busbar in order to prevent the busbar from excessively generating heat associated with an increase in a current that flows through the busbar.

Accordingly, the conventional current detector has a problem that the wider the busbar is, the larger the magnetic core is required in proportion to the width of the busbar, leading to a larger space in which the current detector is installed. In particular, in the case where the magnetic core is in the shape of a circular ring, an ellipsoidal circular ring, or a rectangular ring in which the ratio of the longitudinal length to the lateral length is 1 or approximately 1, a wasted space in the hole portion of the magnetic core is increased as the busbar is wider. Also, in the case where a busbar including a narrowed part that is to be disposed only in the hole portion of the magnetic core is employed, heat may be excessively generated at the narrowed part.

Further, in a stacked-type magnetic core, a dimensional error is likely to occur due to a positional relationship error of a plurality of plate-like members, a dimensional error of an adhesive layer, or the like. Therefore, a current detection error is likely to occur due to the dimensional error of the magnetic core in the conventional current that includes a stacked type magnetic core. Also, the dimensional error of the magnetic core exerts a greater influence as the dimension of the magnetic core becomes smaller, which results in a remarkable deterioration in a current detection accuracy.

Given the above-mentioned problems, an embodiment of this invention provides a current detector for detecting a current that flows through a busbar, in which it is possible to achieve both downsizing of the current detector by employing a relatively small magnetic core based on the relationship with the width of the busbar, and prevention of the busbar from excessively generating heat, and of the current detection accuracy from deteriorating.

A current detector according to an exemplary embodiment is an apparatus for detecting a current that flows through a busbar, and includes:

(1) a magnetic core that is a member molded by sintering powder made from a magnetic material, two ends of the magnetic core facing each other across a gap portion, and the magnetic core being formed in one piece so as to surround a hole portion;

(2) a magneto-electric conversion element that is disposed in the gap portion of the magnetic core and detects a magnetic flux that changes in accordance with a current that passes through the hole portion of the magnetic core; and (3) a current detection busbar that is made of a conductor including a penetrating portion that penetrates the hole portion of the magnetic core and terminal portions that are in connection with the penetrating portion on both sides in a direction in which the penetrating portion penetrates the hole portion and are respectively to be joined with an upstream connection end and a downstream connection end of a current transmission path, the width of the terminal portion being larger than the width of the hole portion.

Further, in the current detector according to another embodiment, it is preferable that the penetrating portion of the current detection busbar have a cross-sectional shape that is homothetically similar to the contour shape of the hole portion of the magnetic core.

Further, the current detector according to an embodiment may have a configuration indicated by the following (3-1):

(3-1) the current detection busbar is configured such that at least one of the terminal portions is in the shape of a flat plate, and the minimum width of the cross-sectional contour of the penetrating portion is larger than the thickness of the terminal portion in the shape of a flat plate.

Further, the current detector according to the present invention may have a configuration indicated by any one of the following (3-2), (3-3), and (3-4):

(3-2) the current detection busbar is a member that has the configuration indicated by (3-1) and is further configured such that at least one of the two end portions of the metal member that penetrates the hole portion of the magnetic core is pressed by press working to the shape of a flat plate and have a larger width than other portions, the portion that was pressed to the shape of a flat plate serving as the terminal portion;

(3-3) the current detection busbar is a member that has a configuration in which at least one of the two end portions of the metal member in the shape of a rod that penetrates the hole portion of the magnetic core is processed by upset processing so as to be thicker than other portions, the portion that was processed so as to be thicker serving as the terminal portion, and (3-4) the current detection busbar is a member that has the configuration indicated by (3-1) and is further configured such that part of the metal member in the shape of a flat plate is folded along slits that are formed on both sides thereof, the folded portion serving as the penetrating portion and portions in the shape of flat plates on both sides of the folded portion serving as the terminal portions.

Also, in the current detection busbar that has the configuration indicated by (3-4), the folded portion may be formed at a position that is shifted towards one end in the width direction of the terminal portion.

The current detector may further include:

(4) an insulating casing that is made from an insulating material, is configured to cover the magnetic core, the penetrating portion of the current detection busbar, and the magneto-electric conversion element in a state where the terminal portions and a connector electrically connected to the magneto-electric conversion element are exposed to the outside. The insulating casing is also configured to hold the magnetic core, the current detection busbar that penetrates the hole portion, and the magneto-electric conversion element that is disposed in the gap portion, while keeping them from coming into contact with each other.

Advantageous Effects of Invention

Hereinafter, in the current detector according to an embodiment, a direction (current flow direction) in which the current detection busbar penetrates the hole portion of the magnetic core is referred to as "first direction". Also, a width direction and a thickness direction of the terminal portions of the current detection busbar that are backward and forward in connection with the penetrating portion penetrating the hole portion of the magnetic core are referred to as "second direction" and "third direction", respectively.

In the current detection busbar included in the current detector according to the present embodiment, the penetrating portion that penetrates the hole portion of the magnetic core is configured such that the maximum width of the cross-sectional contour of the penetrating portion is smaller than the width (maximum width) of the terminal portions that are backward and forward in connection with the penetrating portion. That is, the contour shape of a cross-section of the penetrating portion is narrowed in the second direction as compared with the terminal portion. As a result, a relatively small magnetic core can be employed based on the relationship with the width of the busbar, and thus the size of the entire current detector including the magnetic core can be kept small. Since both end portions of the current detection busbar serve as the terminal portions, it is possible to join the current detection busbar in the state of penetrating the hole portion of the magnetic core with pre-installed upstream busbar and downstream busbar afterwards.

Also, the central portion (penetrating portion) of the current detection busbar that penetrates the hole portion of the magnetic core may be in the shape of, along with a flat plate, a rod or a cylinder, such as a round bar or a square bar. Therefore, this penetrating portion can be configured so as to have a larger cross-sectional area than that of the flat plate-like busbar, within the restriction that the maximum width of the penetrating portion is smaller than the width of the hole portion of the magnetic core. Accordingly, even in the case where a relatively small magnetic core is employed, it is possible to prevent the current detection busbar from excessively generating heat.

Further, in the current detector according to the present embodiment, the magnetic core is a member that is molded by sintering powder made from a magnetic material. In contrast to a stacked-type magnetic core, a dimensional error is not likely to occur in the sintered-type magnetic core, even if it is downsized. Therefore, a current detection error resulting from the dimensional error of the magnetic core is not likely to occur in the current detector in the present embodiment. Further, the sintered-type magnetic core is excellent in that the number of steps and the cost for manufacturing the magnetic core can be reduced as compared to the stacked-type magnetic core.

Also, if the cross-sectional shape of the penetrating portion of the current detection busbar is homothetically similar to the contour shape of the hole portion of the magnetic core, a gap between the penetrating portion and the magnetic core can be made smaller. As a result, it is possible to downsize the current detector by employing the smaller magnetic core.

Also, if the minimum width of the cross-sectional contour of the penetrating portion of the current detection busbar is larger than the thickness (minimum width) of the terminal portion in the shape of a flat plate, the cross-sectional area of the conductor of the penetrating portion is not significantly smaller than that of the conductor of the terminal portion. As a result, heat can be prevented from being excessively generated at the penetrating portion.

Also, if the current detection busbar is a member that has a structure in which end portions of the metal member that penetrates the hole portion of the magnetic core are pressed to the shape of flat plates, the flat plate-like terminal portions that have a larger width than that of the hole portion can be obtained after the metal member that is not in the shape of a flat plate has been inserted into the hole portion of the magnetic core. This makes it easily possible to manufacture a current detection busbar that includes the penetrating portion whose width (diameter) in cross-section is larger than the distance (the height of the gap portion) between both ends of the magnetic core. Note that a rod-shaped metal member or a cylinder-shaped metal member may be employed as a metal member that is not in the shape of a flat plate.

Also, if the current detection busbar has a structure in which the end portions of the metal member in the shape of a rod that penetrates the hole portion of the magnetic core are processed by upset processing so as to be thicker than other portions, the terminal portions that are thicker than the hole portion can be obtained after the rod-shaped metal member has been inserted into the hole portion of the magnetic core. Therefore, the current detection busbar that includes the penetrating portion that has the larger width (diameter) in cross-section than the distance (the height of the gap portion) between both ends of the magnetic core can easily be manufactured. Also, the portions that were processed so as to be thicker serve as, when screw holes are formed therein, the terminal portions to be joined with busbars arranged backward and forward.

Also, if the current detection busbar is a member that has a structure in which part of the flat plate-like metal member is folded along slits that are formed on both sides thereof, the current detection busbar can easily be manufactured. In this case, it is preferable that the folded portion be formed at a position that is shifted towards one end in the width direction of the terminal portion. In this case, even if the minimum width of the contour in cross-section of the penetrating portion is configured to be larger than the height of the gap portion of the magnetic core, it is possible to insert the penetrating portion of the current detection busbar into the hole portion of the magnetic core. The details thereof will be described later.

Also, in the current detector according to an embodiment, the magnetic core, the current detection busbar, and the magneto-electric conversion element are held in a predetermined positional relationship by the insulating casing that covers the magnetic core, the current detection busbar, and the magneto-electric conversion element except for portions that should be exposed. This makes it easily possible to attach the current detector to another pre-installed busbar.

BRIEF DESCRIPTION OF THE DRAWINGS

FIG. 2 shows views of three sides of a current detection busbar 30 included in the current detector 1.

FIG. 6 shows views of three sides of a current detection busbar 30A according to a first modification that can be employed in the current detector 1.

DETAILED DESCRIPTION OF THE EMBODIMENTS

Hereinafter, an embodiment will be described with reference to the drawings. The following embodiment is merely a specific example of the invention, and is not intended to restrict the technical scope of the invention.

Figure 1:
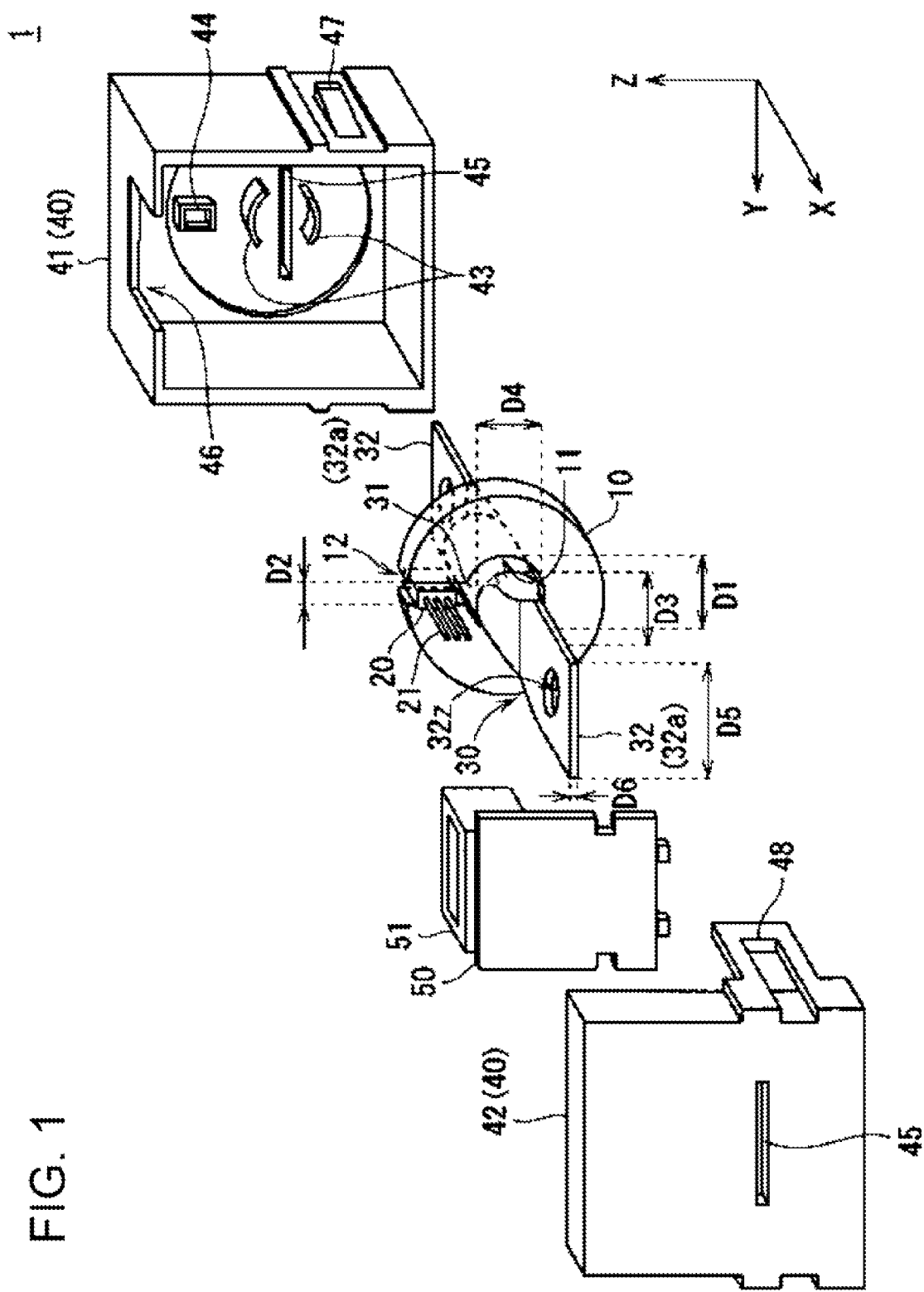
FIG. 1 shows an exploded perspective view of a current detector 1 according to an embodiment of the present invention.

First, the configuration of a current detector 1 according to an embodiment of the present invention will be described with reference to FIGS. 1 to 4. Note that FIG. 2(a) is a plan view, FIG. 2(b) is a side view, and FIG. 2(c) is a front view. The current detector 1 is an apparatus for detecting a current that flows through a busbar electrically connecting a battery and a device such as a motor, in an electric automobile, a hybrid automobile, or the like. As shown in FIG. 1, the current detector 1 includes a magnetic core 10, a Hall element 20, a current detection busbar 30, an insulating casing 40, and an electronic circuit board 50.

<Magnetic Core>

The magnetic core 10 is a member (magnetic material) molded by sintering powder made from a magnetic material such as permalloy, ferrite, or silicon steel. In other words, the magnetic core 10 is obtained in such a manner that an aggregation of solid powder made from a magnetic material is solidified and molded by being pressed in a mold form and then heated at a temperature lower than the melting point of the magnetic material.

Also, the magnetic core 10 is in a shape that has both of its two ends facing each other across a gap portion 12 with a size of approximately several millimeters, and is formed in one piece so as to surround a hole portion 11. The magnetic core 10 is substantially in the shape of a continuous loop except that it has the narrow gap portion 12. The magnetic core 10 in this embodiment is in the shape of a circular ring that surrounds the circular hole portion 11.

<Hall Element (Magneto-electric Conversion Element)>

The Hall element 20 is disposed in the gap portion 12 of the magnetic core 10. The Hall element 20 is an example of a magneto-electric conversion element for detecting a magnetic flux that changes in accordance with a current that passes through the hole portion 11 of the magnetic core 10 and then outputting a detection signal of the magnetic flux as an electrical signal.

<Electronic Circuit Board>

The electronic circuit board 50 is a circuit board on which a circuit to be connected to terminals 21 of the Hall element 20, a connector 51 for connecting this circuit, and another external circuit are mounted. Accordingly, the connector 51 is electrically connected to the Hall element 20. The circuit mounted on the electronic circuit board 50 is, for example, a circuit that amplifies a detection signal of a magnetic flux that was output from the Hall element 20. The Hall element 20 is connected, via the electronic circuit board 50 including the connector 51, to the external circuit.

<Current Detection Busbar>

The current detection busbar 30 is an electric conductor made of a metal such as copper and functions as part of a set of busbars electrically connecting a battery and an electrical device. That is to say, a current that is to be detected flows through the current detection busbar 30. Furthermore, the current detection busbar 30 is a member independent of a battery-side busbar that is connected in advance with the battery and a device-side busbar that is connected in advance with the electrical device. Both end portions of the current detection busbar 30 are respectively connected to other pre-installed upstream and downstream busbars (the battery-side busbar and the device-side busbar). The current detection busbar 30 and the other upstream and downstream busbars that are connected to the current detection busbar 30 form a current transmission path leading from the battery to the electrical device. Note that end portions of the other busbars are examples of connection ends of conductors arranged upstream and downstream of the current detection busbar 30 in the current transmission path.

As shown in FIG. 1, the current detection busbar 30 is obtained by processing both end portions of a conductor in the shape of a rod that penetrates the hole portion 11 of the magnetic core 10. Both of the processed end portions of the current detection busbar 30 serve as the terminal portions 32 that are respectively to be connected to the upstream and downstream connection ends in the current transmission path. The current detection busbar 30 is substantially made of a conductor that includes a penetrating portion 31 in the shape of a rod that occupies a constant range at the center, and terminal portions 32 that are formed so as to extend from the respective two sides of the penetrating portion 31 in the directions in which the penetrating portion 31 penetrates the hole portion 11.

The penetrating portion 31 penetrates through the hole portion 11 of the magnetic core 10 in the current flow direction. The current flow direction is the thickness direction of the magnetic core 10, is the axial direction of a cylinder when taking the ring-like magnetic core 10 as a cylinder, and is the direction orthogonal to a plane formed by the ring-like magnetic core 10. In the drawings, the current flow direction is indicated as the X-axis direction. In the following description, the current flow direction (the X-axis direction) is referred to as "first direction."

The terminal portions 32 in the present embodiment are flat plate-like terminal portions 32a. The penetrating portion 31 of the current detection busbar 30 is in the shape of, for example, a rod such as a cylinder or an elliptic cylinder. In the drawings, the width direction and the thickness direction of the flat plate-like terminal portions 32a are indicated as the Y-axis direction and the Z-axis direction, respectively. In the following description, the width direction (the Y-axis direction) and the thickness direction (the Z-axis direction) of the flat plate-like terminal portion 32a are referred to as "second direction" and "third direction," respectively.

Figure 3:
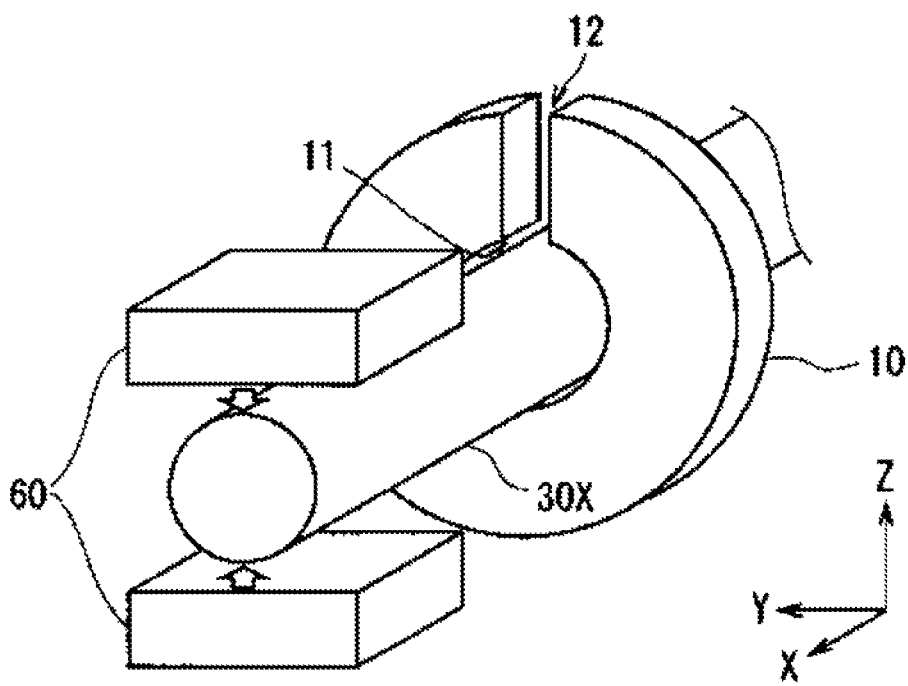
FIG. 3 shows a schematic perspective view of steps for manufacturing the current detection busbar 30.

FIG. 3 shows a schematic perspective view of steps for manufacturing the current detection busbar 30. The current detection busbar 30 has a structure in which both end portions of a metal member 30X in the shape of a rod are processed. The minimum width of the cross-sectional contour of the metal member 30X in the shape of a rod is configured to be larger than a gap height D2, which is a distance between the two ends of the magnetic core 10. Since the metal member 30X shown in FIG. 3 is in the shape of a cylinder, the minimum width of the cross-sectional contour of the metal member 30X is the diameter of the metal member 30X.

To be more specific, the current detection busbar 30 is a member that has a structure in which portions in a constant range at both ends of the metal member 30X in the shape of a rod that penetrates the hole portion 11 of the magnetic core 10 are pressed by press working using a pressing machine 60 and the like to the shape of flat plates. At that time, at least one end of the metal member 30X in the shape of a rod is subjected to press working so as to be in the shape of a flat plate after the metal member 30X in the shape of a rod has been inserted into the hole portion 11 of the magnetic core 10.

That is to say, the steps for manufacturing the current detection busbar 30 in the processes for manufacturing the current detector 1 are executed by the following procedures, for example: [1] First, a penetrating step of passing the rod-shaped metal member 30X through the hole portion 11 of the magnetic core 10 is executed; [2] Next, a first pressing step of pressing one end portion of the rod-shaped metal member 30X with the pressing machine 60 or the like to the shape of a flat plate that has a larger width than other portions is executed; and [3] Finally, a second pressing step of pressing the other end portion of the rod-shaped metal member 30X with the pressing machine 60 or the like to the shape of a flat plate that has a larger width than other portions is executed.

In the above-described manufacturing steps, the penetrating step [1] is preferably executed before either or both of the first pressing step [2] or/and the second pressing step [3] is executed. For example, a configuration is also possible in which the penetrating step [1] is first executed, and then both the first pressing step [2] and the second pressing step [3] are executed at the same time. Alternatively, a configuration is possible in which the first pressing step [2] is first executed, the penetrating step [1] is then executed, and the second pressing step [3] is finally executed.

The both end portions that were pressed to the shape of flat plates serve as the terminal portions 32a in the shape of flat plates of the current detection busbar 30, and the rod-shaped portion therebetween serves as the penetrating portion 31 of the current detection busbar 30.

The metal member 30X shown in FIG. 3 is a member in the shape of a cylinder, and the penetrating portion 31 of the current detection busbar 30 that is manufactured by such processing of both ends of the metal member 30X is in the shape of a cylinder. Note that the rod-shaped metal member 30X may also be in the shape of an elliptical rod whose cross-section is an ellipse, or a square bar whose cross-section is a rectangle. Also, the rod-shaped metal member 30X may be in the shape of a rod whose cross-section is a polygon other than a quadrangle.

It is preferable that the cross-sectional shape of the metal member 30X, that is, the cross-sectional shape of the penetrating portion 31 be homothetically similar to the contour shape of the hole portion 11 of the magnetic core 10. For example, in the case where the contour shape of the hole portion 11 of the magnetic core 10 is a regular polygon with N sides, where N is assumed to be an integer of 3 or more, it is preferable that the shape of the metal member 30X be a regular prism with N sides. Also, in the case where the contour shape of the hole portion 11 of the magnetic core 10 is circular, it is preferable that the shape of the metal member 30X be a cylinder. Also, in the case where the contour shape of the hole portion 11 of the magnetic core 10 is an ellipse in which the ratio of the long axis to the short axis is R, it is preferable that the shape of the metal member 30X be an elliptic cylinder where the ratio of the long axis to the short axis in the cross-section is R.

In the current detection busbar 30, the width D5 of the flat plate-like terminal portion 32a is configured to be larger than the diameter D1 (maximum width) of the hole portion 11. Also, the minimum width D4 of the cross-sectional contour of the penetrating portion 31 is configured to be larger than the thickness D6 of the flat plate-like terminal portion 32a. That is, the ratio of the vertical size to the horizontal size of the cross-sectional contour of the penetrating portion 31 is closer to 1 than the ratio of the vertical size to the horizontal size of the cross-section of the flat plate-like terminal portion 32. Note that in the case where the penetrating portion 31 is in the shape of a cylinder, the minimum width D4 and the maximum width D3 of the cross-sectional contour of the penetrating portion 31 are the same. Also, the condition that the ratio is closer to 1 includes the case that the ratio is 1.

Further, in the current detection busbar 30, the minimum width D4 of the cross-sectional contour of the penetrating portion 31 is configured to be larger than the gap height D2, which is a distance between the two ends of the magnetic core 10. Furthermore, as described above, the width D5 of the flat plate-like terminal portion 32a is larger than the diameter D1 (maximum width) of the hole portion 11 of the magnetic core 10. Therefore, it is impossible to install the magnetic core 10 on the pre-manufactured penetrating portion 31 of the current detection busbar 30. As a result, a set of the magnetic core 10 and the current detection busbar 30 in the state of penetrating the hole portion 11 of that magnetic core 10 is provided, and then the current detection busbar 30 is connected to other upstream and downstream busbars.

Figure 5:
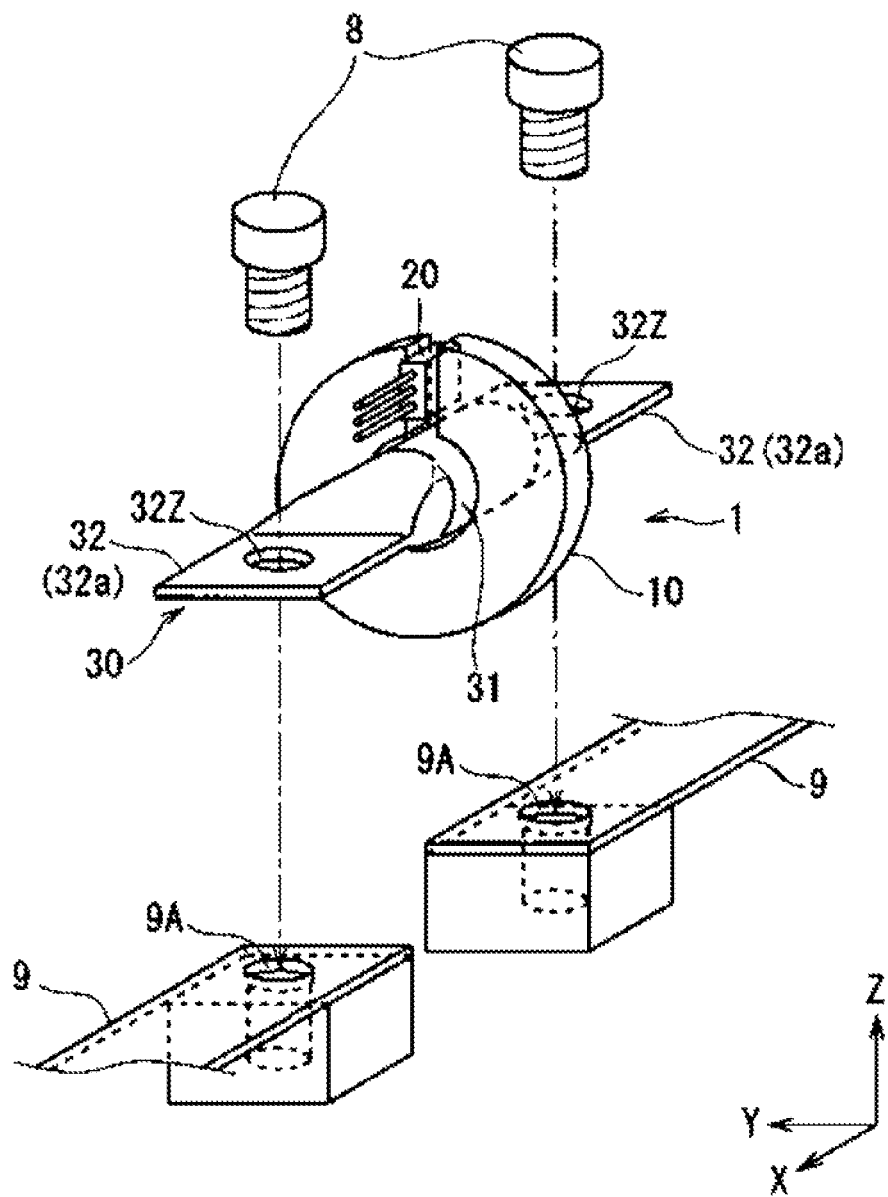
FIG. 5 shows a schematic perspective view of a state in which the current detector 1 is to be joined with pre-installed busbars.

The terminal portions 32a in the shape of flat plates are provided with screw through holes 32Z, and the terminal portions 32a in the shape of flat plates are connected, via screws, to other upstream and downstream busbars. FIG. 5 is a schematic perspective view of a state in which the flat plate-like terminal portions 32a of the current detector 1 are joined with other pre-installed upstream and downstream busbars 9 via screws 8.

Note that, in FIG. 5, the insulating casing 40 is not shown for the sake of convenience. As shown in FIG. 5, the connection ends of the other busbars 9 that are to be joined with the flat plate-like terminal portion 32a are configured as terminal blocks, for example, and have screw holes 9A. Note that the terminal portions 32 of the current detection busbar 30 may be other than the flat plate-like terminal portions 32a provided with screw through-holes 32Z, such as portions having fitting mechanisms to the other busbars 9.

<Insulating Casing>

The insulating casing 40 is a member that is made from an insulating material and holds the magnetic core 10, the Hall element 20, the current detection busbar 30, and the electronic circuit board 50. The insulating casing 40 includes a casing main body 41 and a cover member 42 that is attached to the casing main body 41. The casing main body 41 and the cover member 42 are, for example, each a monolithic molded member made of insulating resin such as polyamide (PA), polypropylene (PP), polybutylene terephthalate (PBT), or ABS resin.

The casing main body 41 is in the shape of a box having an opening portion, and the cover member 42 covers the opening portion of the casing main body 41 when attached to the casing main body 41. The internal face of the casing main body 41 has first holding portions 43 and a second holding portion 44 that project out from the surface. On the casing main body 41, the first holding portions 43 and the second holding portion 44 hold the magnetic core 10, the current detection busbar 30 that penetrates through the hole portion 11, and the Hall element 20 that is disposed in the gap portion 12, while keeping them from coming into contact with each other.

More specifically, the first holding portions 43 are fitted into a gap between the magnetic core 10 and the penetrating portion 31 of the current detection busbar 30 that penetrates through the hole portion 11 of the magnetic core 10, thereby holding the magnetic core 10 and the current detection busbar 30 while keeping them from coming into contact with each other. Furthermore, the second holding portion 44 is fitted into a gap between the magnetic core 10 and the Hall element 20 that is disposed in the gap portion 12 of the magnetic core 10, thereby holding the magnetic core 10 and the Hall element 20 while keeping them from coming into contact with each other.

Furthermore, the casing main body 41 and the cover member 42 have respectively slot-shaped terminal portion through-holes 45 through which the terminal portions 32 at both end portions of the current detection busbar 30 are inserted from the inside to the outside. In a state where one terminal portion 32 of the current detection busbar 30 that penetrates through the hole portion 11 of the magnetic core 10 has been inserted through the terminal portion through-hole 45 of the casing main body 41, the first holding portions 43 and the second holding portion 44 of the casing main body 41 hold the magnetic core 10, the Hall element 20, and the current detection busbar 30.

Furthermore, the cover member 42 is attached to the casing main body 41 holding the magnetic core 10, the Hall element 20, and the current detection busbar 30 such that the cover member 42 covers the opening portion of the casing main body 41 while sandwiching the electronic circuit board 50 therebetween. At that time, the other terminal portion 32 of the current detection busbar 30 is inserted through the terminal portion through-hole 45 of the cover member 42 from the inside to the outside. Further, when the electronic circuit board 50 is sandwiched between the casing main body 41 and the cover member 42, the connector 51 mounted on the electronic circuit board 50 is held in a state where it is fitted to a cut-out portion 46 that is formed in the casing main body 41.

Furthermore, the casing main body 41 and the cover member 42 are provided with lock mechanisms 47 and 48 that hold the casing main body 41 and the cover member 42 such that they are combined with each other. The lock mechanisms 47 and 48 shown in FIG. 1 are respectively configured as a catch portion 47 that is formed so as to project from a side face of the casing main body 41 and a frame portion 48 that is in the shape of a loop on a side face of the cover member 42. When the catch portion 47 of the casing main body 41 is fitted to the hole defined by the frame portion 48 of the cover member 42, the casing main body 41 and the cover member 42 are held in a state where they are combined with each other.

Figure 4:
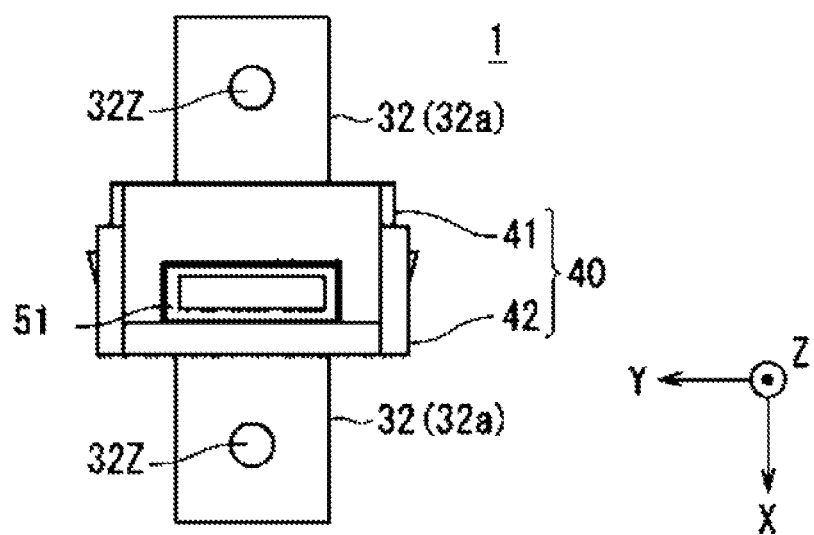
FIG. 4 shows a plan view of the current detector 1.

FIG. 4 shows a plan view of the current detector 1 in the state where the casing main body 41 and the cover member 42 are combined with each other. As shown in FIG. 4, the casing main body 41 and the cover member 42 (the insulating casing 40) cover and hold the magnetic core 10, the penetrating portion 31 of the current detection busbar 30, and the Hall element 20 in the state where the portions (terminal portions) of the terminal portion 32 of the current detection busbar 30 in which the through-holes 32Z are formed and the connector 51 of the electronic circuit board 50 are exposed to the outside.

The above-described current detection busbar 30 of the current detector 1 is configured such that the maximum width D3 of the cross-sectional contour of the penetrating portion 31 is smaller than the width D5 (maximum width) of the terminal portion. That is, the contour shape of the penetrating portion 31 in cross-section is narrower than that of the terminal portion 32 in the second direction. As a result, in the current detector 1, a relatively small magnetic core 10 can be employed based on the relationship with the width of other upstream and downstream busbars, and thus the size of the entire current detector including the magnetic core 10 can be kept small.

Also, in the current detection busbar 30, the penetrating portion 31 that penetrates the hole portion 11 of the magnetic core 10 is in the shape other than a flat plate, such as a round bar or a square bar. Therefore, that penetrating portion 31 can be formed so as to have a larger cross-sectional area than that of a flat plate-like busbar, with the restriction that the maximum width of the penetrating portion 31 is smaller than the diameter D1 (width) of the hole portion 11 of the magnetic core 10. Therefore, even if a relatively small magnetic core 10 is employed, it is possible to prevent the current detection busbar 30 from excessively generating heat.

Also, if the cross-sectional shape of the penetrating portion 31 of the current detection busbar 30 is homothetically similar to the contour shape of the hole portion 11 of the magnetic core 10, it is possible to make the gap between the penetrating portion 31 and the magnetic core 10 smaller. As a result, employing the smaller magnetic core 10 enables downsizing of the current detector.

Moreover, in the current detection busbar 30, the minimum width D4 of the cross-sectional shape of the penetrating portion 31 is configured to be larger than the thickness D6 (minimum width) of the terminal portion 32. In the current detection busbar 30 that has a structure in which both end portions of the metal member 30X in the shape of a rod are pressed to the shape of flat plates, the cross-sectional area of the conductor of the penetrating portion 31 is larger than that of the conductors of the terminal portions 32. This makes it possible to prevent heat from being excessively generated at the penetrating portion 31. Note that since the terminal portions 32, together with the connection screws 8 and other busbars 9 that are pressed so as to come into contact with the terminal portions 32, are portions that have a large heat capacity, a problem of heat generation due to the presence of the hole 32Y does not occur.

Also, in the current detection busbar 30 that has a structure in which both end portions of the metal member 30X in the shape of a rod are pressed to the shape of flat plates, the terminal portions 32 in the shape of flat plates that each have a larger width than the width D1 of the hole portion 11 can be obtained after the rod-shaped metal member 30X has been inserted into the hole portion 11 of the magnetic core 10. That is, the penetrating portion 31 does not need to pass through the gap portion 12 of the magnetic core 10. Accordingly, the current detection busbar 30 in which the width D3 (diameter) of the rod-shaped penetrating portion 31 in cross-section is larger than the gap height D2 of the magnetic core 10 can easily be manufactured.

Note that in order to improve current detection sensitivity, it is preferable to make the gap height D2 smaller, and to make the gaps between the Hall element 20 disposed in the gap portion 12 and the two ends of the magnetic core 10 smaller.

Also, in the current detector 1, the magnetic core 10, the Hall element 20, and the current detection busbar 30 are held in a predetermined positional relationship by the insulating casing 40 that covers portions other than portions that should be exposed, such as the through-holes 32Z on the terminal portions 32 (terminal portions) and the connector 51. This makes an operation for mounting the current detector 1 on a pre-installed busbar 9 easy.

Also, in the current detector 1, the magnetic core 10 is a member molded by sintering powder made from a magnetic material. In contrast to a stacked-type magnetic core, a dimensional error is not likely to occur in the sintered-type magnetic core 10 even if it is downsized. Therefore, a current detection error resulting from the dimensional error of the magnetic core 10 is not likely to occur in the current detector 1. Further, the sintered-type magnetic core 10 is advantageous because the number of steps and the cost for manufacturing the magnetic core can be reduced as compared to the stacked-type magnetic core.

<Current Detection Busbar (First Modification)>

Figure 7:
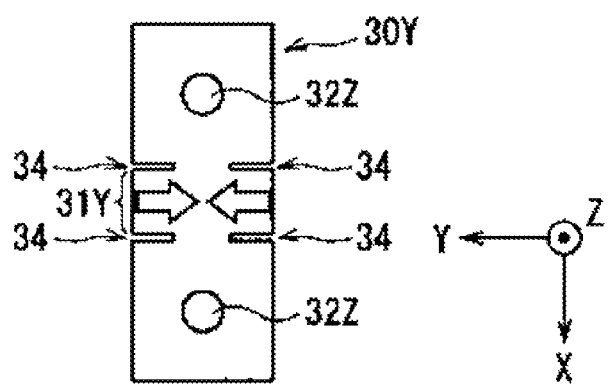
FIG. 7 shows a plan view of a member that mainly constitutes the current detection busbar 30A.

Hereinafter, a current detection busbar 30A according to a first modification that can be employed in the current detector 1 will be described with reference to FIGS. 6 and 7. FIG. 6 shows views of three sides of the current detection busbar 30A. FIG. 7 shows a plan view of a metal member 30Y in the shape of a flat plate that mainly constitutes the current detection busbar 30A. Note that in FIG. 6, the magnetic core 10 that is to be combined with the current detection busbar 30A is indicated by a virtual line (dashed-two dotted line). FIG. 6(a) is a plan view, FIG. 6(b) is a side view, and FIG. 6(c) is a front view.

In FIGS. 6 and 7, the same reference numerals are given to the same constituent components as those shown in FIGS. 1 to 5. Hereinafter, only differences between the current detection busbar 30A and the current detection busbar 30 will be described.

Similar to the current detection busbar 30, the current detection busbar 30A is a member made of a conductor that includes a penetrating portion 31A that penetrates the hole portion 11 of the magnetic core 10 in the first direction (X-axis direction), and terminal portions 32a in the shape of flat plates that are in connection with the penetrating portion 31A on both sides in the first direction.

Also in the current detection busbar 30A, the width D5 of the terminal portion 32a is configured to be larger than the diameter D1 (maximum width) of the hole portion 11. Also, the minimum width D4 of the cross-sectional contour of the penetrating portion 31A is configured to be larger than the thickness D6 of the terminal portion 32a.

On the other hand, in the current detection busbar 30A, the minimum width D4 of the cross-sectional contour of the penetrating portion 31A is configured to be smaller than the gap height D2, which is a distance between both ends of the magnetic core 10. Therefore, the magnetic core 10 can be mounted on the penetrating portion 31A of the pre-manufactured current detection busbar 30A through the gap portion 12.

The current detection busbar 30A has a structure in which portions 31Y of the flat plate-like metal member 30Y are folded from both sides in the second direction (Y-axis direction) along slits 34 that are formed on both sides of the portions 31Y in the first direction (X-axis direction).

The slits 34 of the metal member 30Y are formed on both sides of the portions 31Y in the first direction (X-axis direction) so as to extend from both ends of the metal member 30Y in the second direction (Y-axis direction) toward the inside. Also, the folded portions 31Y serve as the penetrating portion 31A of the current detection busbar 30A, and portions on both sides of the folded portions 31Y serve as the terminal portions 32a. Such a current detection busbar 30A is easy to be manufactured.

Also in the current detection busbar 30A, the contour shape of the penetrating portion 31A in cross-section is narrower than that of the terminal portions 32a in the second direction (Y-axis direction). As a result, even in the case where the current detector 1 employs the current detection busbar 30A, a relatively small magnetic core 10 can be employed based on the relationship with the width of the busbar, and thus the size of the entire current detector including the magnetic core 10 can be kept small.

Further, in the current detection busbar 30A, the contour shape of the penetrating portion 31A in cross-section is configured such that the minimum width D4 of the penetrating portion 31A is larger than the thickness D6 (minimum width) of the terminal portion 32a. Accordingly, the cross-sectional area of the conductor of the penetrating portion 31A is not significantly smaller than that of the conductor of the terminal portion 32a. In particular, in the current detection busbar 30A that has the structure in which portions of the flat plate-like metal member 30Y are folded, the cross-sectional area of the conductor of the penetrating portion 31A is the same as the cross-sectional area of the conductor of the terminal portion 32a.

In the current detection busbar 30A, however, portions of the conductor where the slits 34 are formed between the penetrating portion 31A and the terminal portions 32a each have a conductor cross-sectional area smaller than that of a portion located in front of or behind that portion. However, experiments found that, if the width of the slit 34 is very narrow, the increase in the impedance at the portions where the slits 34 are formed has a small value that is almost negligible in the entire current detection busbar 30A. Therefore, if the slits 34 formed in the current detection busbar 30A each have a very narrow width, heat can be prevented from being excessively generated at the penetrating portion 31.

<Current Detection Busbar (Second Modification)>

Figure 8A:
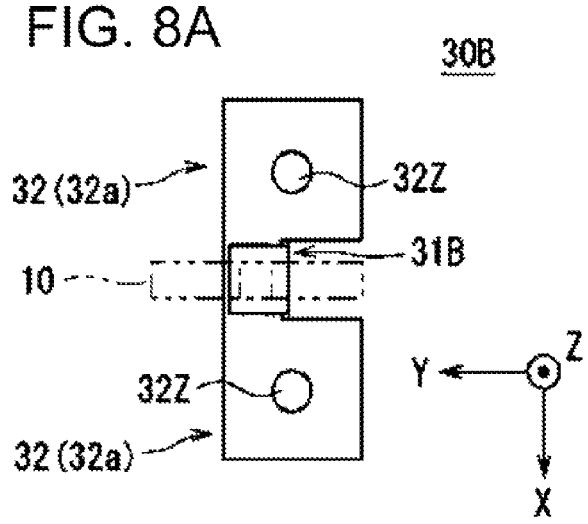
FIG. 8 shows views of three sides of a current detection busbar 30B according to a second modification that can be employed in the current detector 1.
Figure 8B:
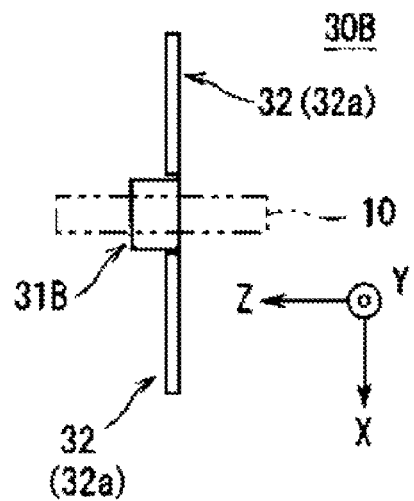
Figure 8C:
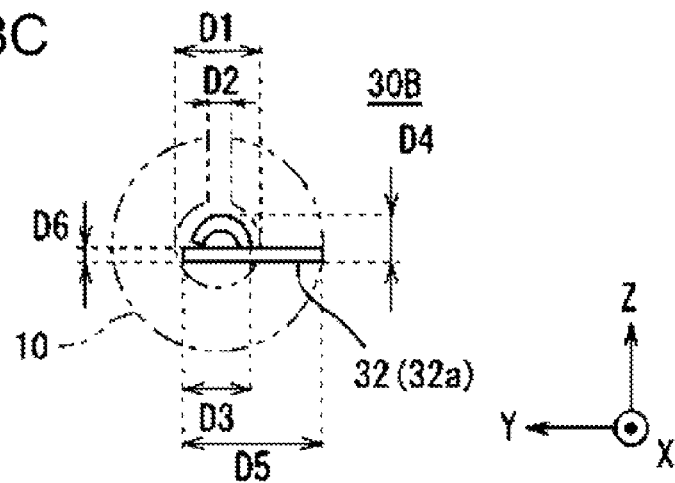
Figure 9:
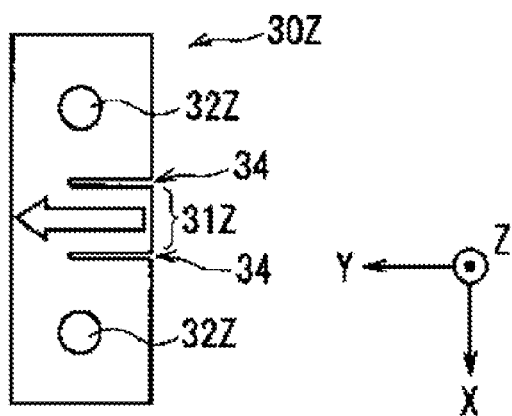
FIG. 9 shows a plan view of a member that mainly constitutes the current detection busbar 30B.
Figure 10:
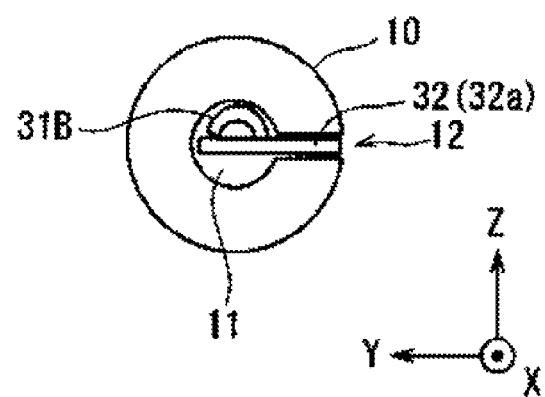
FIG. 10 shows a state in which the current detection busbar 30B is inserted into a hole portion of a magnetic core.

Next, a current detection busbar 30B according to a second modification that can be employed in the current detector 1 will be described with reference to FIGS. 8 to 10. FIG. 8 shows views of three sides of the current detection busbar 30B. FIG. 9 shows a plan view of a metal member 30Z in the shape of a flat plate that mainly constitutes the current detection busbar 30B. FIG. 10 is a diagram illustrating the state in which the current detection busbar 30B is inserted into the hole portion 11 of the magnetic core 10. Note that in FIG. 8, the magnetic core 10 that is to be combined with the current detection busbar 30B is indicated by a virtual line (dashed-two dotted line). FIG. 8(a) is a plan view, FIG. 8(b) is a side view, and FIG. 8(c) is a front view.

In FIGS. 8 to 10, the same reference numerals are given to the same components as those shown in FIGS. 1 to 5. Hereinafter, only differences between the current detection busbar 30B and the current detection busbar 30 will be described.

Similar to the current detection busbar 30, the current detection busbar 30B is made of a conductor including a penetrating portion 31B that penetrates the hole portion 11 of the magnetic core 10 in the first direction (X-axis direction), and terminal portions 32a in the shape of flat plates that extend from both sides of the penetrating portion 31B in the first direction.

Also in the current detection busbar 30B, the width D5 of the terminal portion 32a is configured to be larger than the diameter D1 (maximum width) of the hole portion 11. Also, the minimum width D4 of the cross-sectional contour of the penetrating portion 31B is configured to be larger than the thickness D6 of the terminal portion 32a.

The current detection busbar 30B is a member that has a structure in which a portion 31Z of the flat plate-like metal member 30Z is folded from one side in the second direction (Y-axis direction) along slits 34 that are formed on both sides of this portion 31Z in the first direction (X-axis direction). The slits 34 of the metal member 30Z are formed on both sides of the portion 31Z in the first direction (X-axis direction) so as to extend from one end in the second direction (Y-axis direction) toward the inside. The folded portion 31Z serves as the penetrating portion 31B of the current detection busbar 30B, and portions on both sides of the folded portion 31Z serve as the terminal portions 32a. Such a current detection busbar 30B is also easy to manufacture.

In the current detection busbar 30B, the minimum width D4 of the cross-sectional contour of the penetrating portion 31B is configured to be larger than the gap height D2, which is a distance between both ends of the magnetic core 10. Further, in the current detection busbar 30B, the penetrating portion 31B, that is, the folded portion 31Z is formed at a position that is shifted towards one end in the second direction (Y-axis direction). In the examples shown in FIGS. 8 to 10, the penetrating portion 31B is formed at a position that is shifted towards the end in the plus direction in Y-axis.

In the current detection busbar 30B that has the above-described structure, even if the minimum width D4 of the cross-sectional contour of the penetrating portion 31B is configured to be larger than the gap height D2 of the magnetic core 10, the penetrating portion 31B can be inserted into the hole portion 11 of the magnetic core 10.

That is to say, as shown in FIG. 10, when seen in the first direction (X-axis direction), the current detection busbar 30B and the magnetic core 10 are arranged such that the entire penetrating portion 31B is located so as to overlap with the hole portion 11, and the terminal portions 32a are located so as to overlap with both the hole portion 11 and the gap portion 12 but not the magnetic core 10. In this state, by shifting the current detection busbar 30B or the magnetic core 10 in the first direction (X-axis direction), the penetrating portion 31B can be inserted into the hole portion 11 of the magnetic core 10. Therefore, it is possible to mount the magnetic core 10 on the pre-installed penetrating portion 31B of the current detection busbar 30B.

<Current Detection Busbar (Third Modification)>

Figure 11:
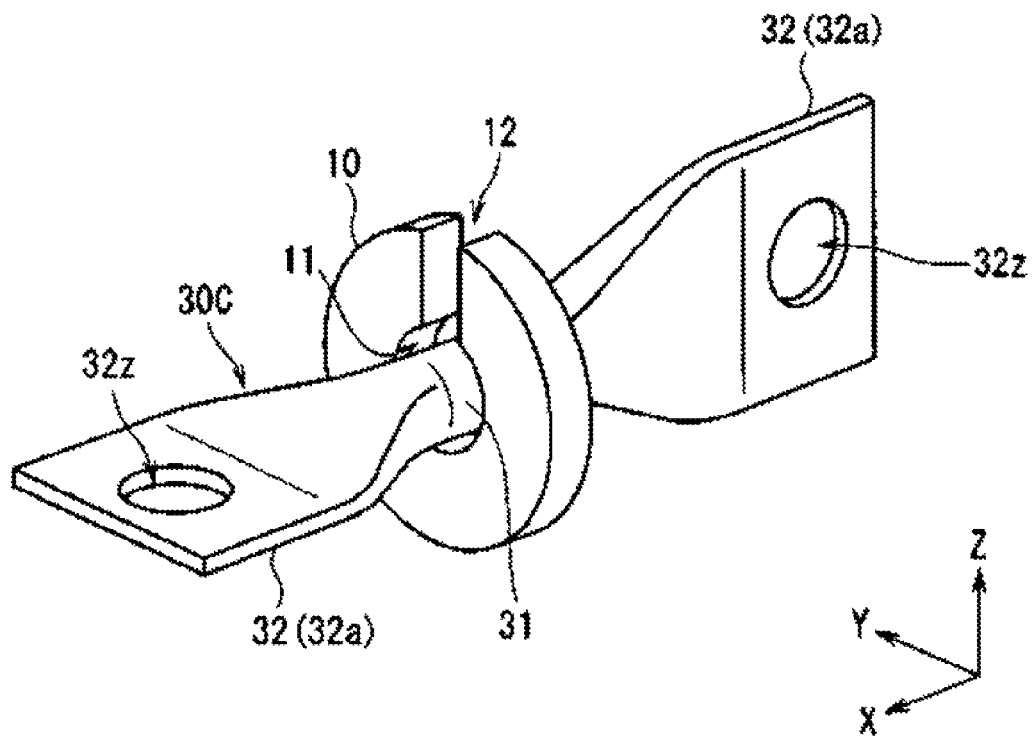
FIG. 11 shows a perspective view of a current detection busbar 30C according to a third modification and the magnetic core that can be employed in the current detector 1.

Next, a current detection busbar 30C according to a third modification that can be employed in the current detector 1 will be described with reference to FIG. 11. FIG. 11 shows a perspective view of the current detection busbar 30C and the magnetic core 10. In FIG. 11, the same reference numerals are given to the same constituent components as those shown in FIGS. 1 to 5. Hereinafter, only differences between the current detection busbar 30C and the current detection busbar 30 will be described.

Similar to the current detection busbar 30, the current detection busbar 30C includes a penetrating portion 31 that penetrates the hole portion 11 of the magnetic core 10 in the first direction (X-axis direction), and terminal portions 32a in the shape of flat plates that extend from both sides of the penetrating portion 31 in the first direction.

However, the two flat plate-like terminal portions 32a of the current detection busbar 30C are respectively formed along planes that are not in parallel to each other. In the example shown in FIG. 11, one of the two flat plate-like terminal portions 32a is formed along the X-Y plane and the other is formed along the X-Z plane. In the current detector 1, the current detection busbar 30C as shown in FIG. 11 may be employed instead of the current detection busbar 30.

The current detection busbar 30C shown in FIG. 11 is preferably employed in the case where the upstream busbar and the downstream busbar respectively define planes at different angles. Note that the two flat plate-like terminal portions 32a may be formed along two planes that intersect with each other at an angle of 90° as shown in FIG. 11 or at an angle other than 90°.

<Current Detection Busbar (Fourth Modification)>

Figure 12:
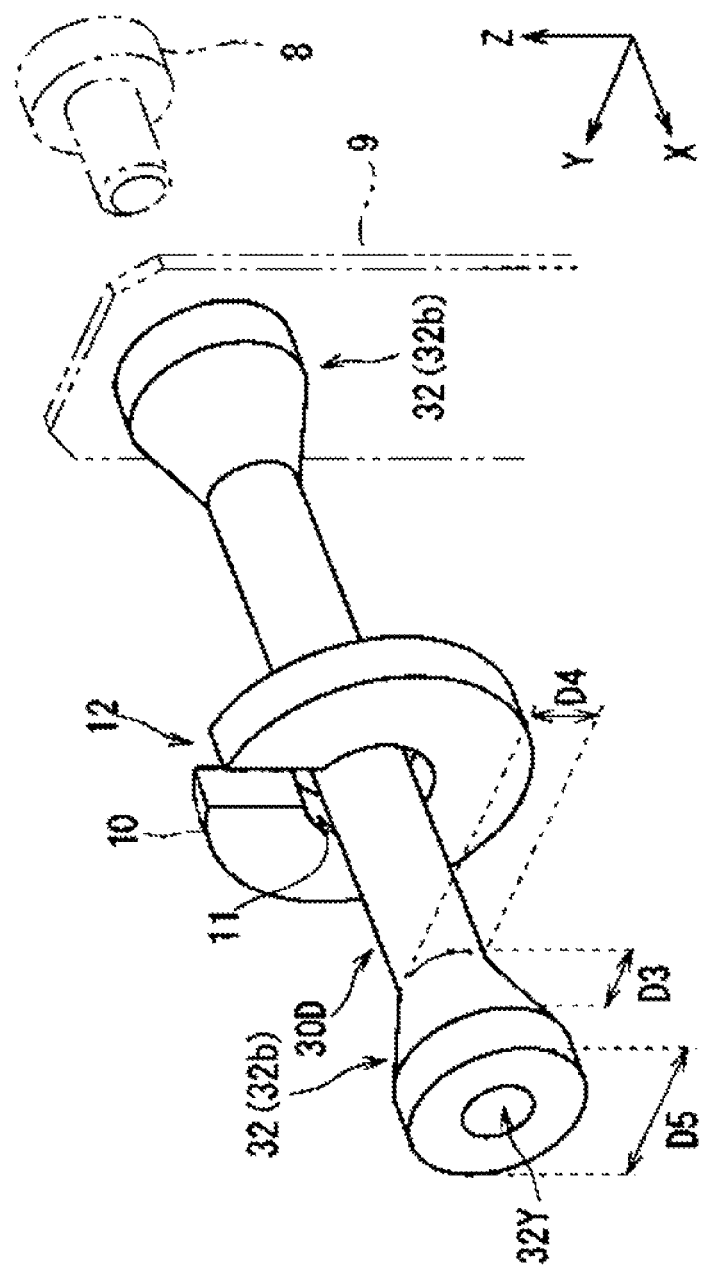
FIG. 12 shows a perspective view of a current detection busbar 30D according to a fourth modification and the magnetic core that can be employed in the current detector 1.

Next, a current detection busbar 30D according to a fourth modification that can be employed in the current detector 1 will be described with reference to FIG. 12. FIG. 12 shows a perspective view of the current detection busbar 30D and the magnetic core 10. In FIG. 12, the same reference numerals are given to the same constituent components as those shown in FIGS. 1 to 5. Hereinafter, only differences between the current detection busbar 30D and the current detection busbar 30 will be described.

The current detection busbar 30D differs from the current detection busbars 30 and 30A in the shape of the terminal portions 32 on both end portions of the current detection busbar 30D. The terminal portions 32 of the current detection busbar 30D are portions that are located on end portions of the rod-shaped metal member 30X and processed by upset processing so as to be thicker than other portions. Hereinafter, the terminal portions 32 that are processed in such a manner are referred to as large-diameter terminal portions 32b. Further, these large-diameter terminal portions 32b are respectively provided with screw holes 32Y through which screws 8 for connecting the large-diameter terminal portions 32b and connection ends of other upstream busbar and downstream busbar are screwed.

Figure 13:
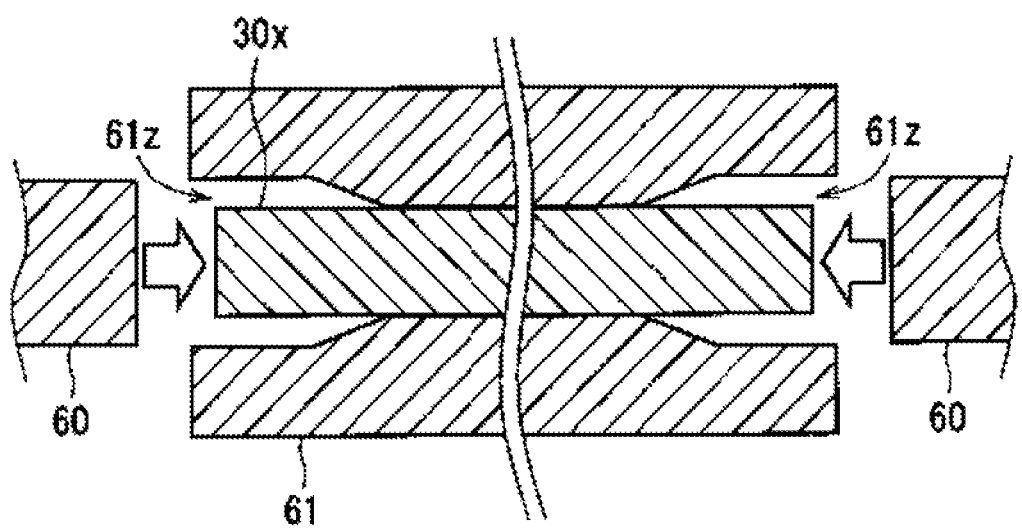
FIG. 13 shows a schematic cross-sectional view of steps for manufacturing the current detection busbar 30D.

FIG. 13 is a schematic perspective view illustrating steps for manufacturing the current detection busbar 30D. Similar to the current detection busbar 30, the current detection busbar 30D has a structure in which both end portions of the metal member 30X in the shape of a rod are processed. The minimum width of the cross-sectional contour of the rod-shaped metal member 30X is configured to be larger than the gap height D2, which is a distance between both ends of the magnetic core 10.

To be more specific, the large-diameter terminal portions 32b of the current detection busbar 30D are portions obtained by molding end portions of the rod-shaped metal member 30X that penetrates the hole portion 11 of the magnetic core 10 by upset processing using a jig 61 that includes a mold form unit 61z for forming the large-diameter terminal portions 32b, and the pressing machine 60.

The jig 61 holds portions other than the end portions of the rod-shaped metal member 30X in accordance with the original shapes of the portions. Also, the mold form unit 61z of the jig 61 surrounds the end portion of the rod-shaped metal member 30X at a distance. The end portions of the rod-shaped metal member 30X held by the jig 61 are pressed by the pressing machine 60 along the rod-shaped metal member 30X in the axis direction. Accordingly, the end portions of the rod-shaped metal member 30X are processed so as to be thicker than other portions. At that time, at least one of the two end portions of the rod-shaped metal member 30X is subjected to upset processing after the rod-shaped metal member 30X has been inserted into the hole portion 11 of the magnetic core 10.

That is to say, the steps for manufacturing the current detection busbar 30 in the processes for manufacturing the current detector 1 are executed by the following procedures, for example: [1] First, a penetrating step of passing the rod-shaped metal member 30X through the hole portion 11 of the magnetic core 10 is executed; [2] Next, a first upset processing step of processing one end portion of the rod-shaped metal member 30X with the pressing machine 60, the jig 61, and the like so that the one end portion is thicker than other portions is executed; and [3] Finally, a second upset processing step of processing the other end portion of the rod-shaped metal member 30X is executed with the pressing machine 60, the jig 61, and the like so that the other end portion is thicker than other portions.

In the above-mentioned manufacturing steps, the penetrating step [1] is preferably executed before either or both of the first upset processing step [2] or/and the second upset processing step [3] is executed. For example, a configuration is also possible in which the penetrating step [1] is first executed, and then the first upset processing step [2] and the second upset processing step [3] are executed at the same time. Alternatively, a configuration is also possible in which the first upset processing step [2] is first executed, the penetrating step [1] is then executed, and the second upset processing step [3] is finally executed.

Both of the two end portions that were processed so as to be thicker than other portions serve as the large-diameter terminal portions 32b of the current detection busbar 30D, and the rod-shaped portion therebetween serves as the penetrating portion 31 of the current detection busbar 30D.

The metal member 30X that mainly constitutes the current detection busbar 30D shown in FIG. 12 is a member in the shape of a cylinder, and the penetrating portion 31 of the current detection busbar 30D that is manufactured by processing both end portions of the metal member 30X is in the shape of a cylinder. Note that, similarly to the case of the current detection busbars 30 and 30A, the rod-shaped metal member 30X that mainly constitutes the current detection busbar 30D may be in the shape of an elliptical rod whose cross-section is an ellipse or in the shape of a rod whose cross-section is a polygon. Also in the current detection busbar 30D, it is preferable that the cross-sectional shape of the metal member 30X that mainly constitutes the current detection busbar 30D, that is, the cross-sectional shape of the penetrating portion 31 be homothetically similar to the contour shape of the hole portion 11 of the magnetic core 10.

Also, the maximum width D5 of the large-diameter terminal portion 32b shown in FIG. 12 is configured to be larger than the maximum width D3 of the penetrating portion 31 and the diameter D1 (maximum width) of the hole portion 11. Accordingly, the thickness of the penetrating portion 31, that is, the thickness of the original rod-shaped metal member 30X may not necessarily be a thickness that is sufficient for the screw hole 32Y to be formed therein. In the current detector 1, the current detection busbar 30D as shown in FIG. 12 may be employed instead of the current detection busbar 30.

<Current Detection Busbar (Fifth Modification)>

Figure 14:
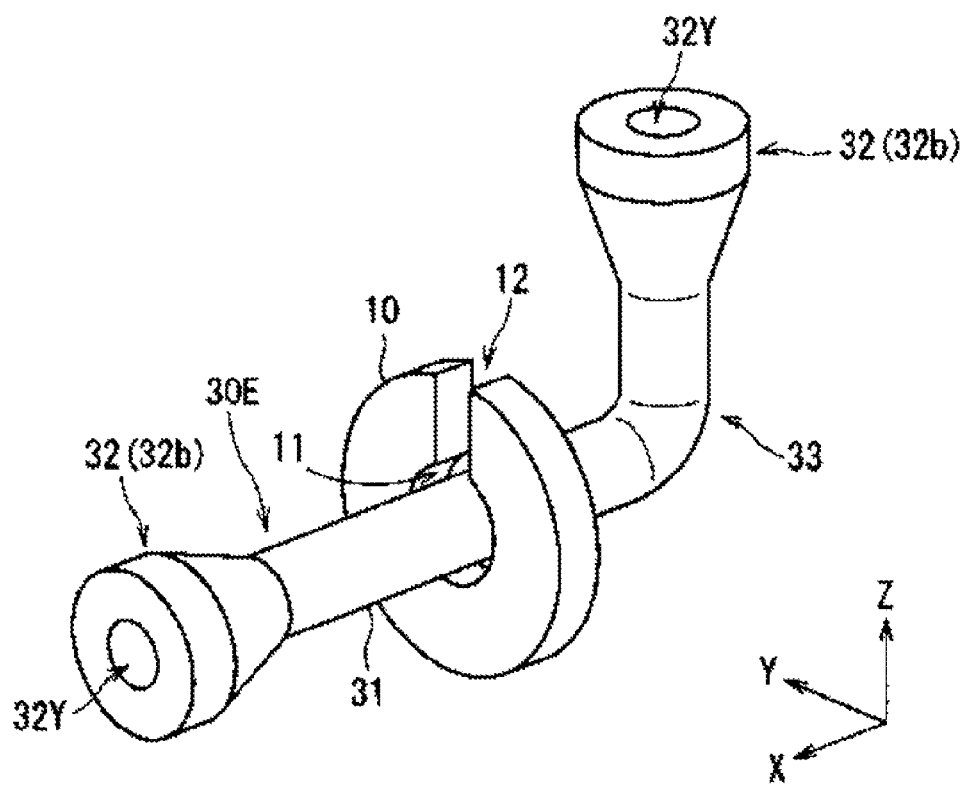
FIG. 14 shows a perspective view of a current detection busbar 30E according to a fifth modification and a magnetic core that can be employed in the current detector 1.

Next, a current detection busbar 30E according to a fifth modification that can be employed in the current detector 1 will be described with reference to FIG. 14. FIG. 14 shows a perspective view of the current detection busbar 30E and the magnetic core 10. In FIG. 14, the same reference numerals are given to the same constituent components as those shown in FIGS. 1 to 12. Hereinafter, only differences between the current detection busbar 30E and the current detection busbar 30D will be described.

Similar to the current detection busbar 30D, the current detection busbar 30E includes a penetrating portion 31 that penetrates the hole portion 11 of the magnetic core 10 in the first direction (X-axis direction), and large-diameter terminal portions 32b that are in connection with the penetrating portion 31 on both sides in the first direction.

However, the current detection busbar 30E includes a bent portion 33 between the large-diameter terminal portion 32b and the penetrating portion 31. The current detection busbar 30E shown in FIG. 14 includes a bent portion 33 that is bent at an angle of 90° between the large-diameter terminal portion 32b and the penetrating portion 31. In the current detector 1, the current detection busbar 30E as shown in FIG. 14 may be employed instead of the current detection busbar 30.

The current detection busbar 30E shown in FIG. 14 is preferably employed in the case where the upstream busbar and the downstream busbar respectively define planes at different angles. Note that the angle of bend of the bent portion 33 may be 90° as shown in FIG. 14 or another angle. In the current detector 1, the current detection busbar 30E as shown in FIG. 14 may be employed instead of the current detection busbar 30. Alternatively, the current detection busbars 30 and 30A may include the bent portion 33, similarly to the current detection busbar 30E.

Note that, similar to the current detection busbar 30, the insulating casing 40 holds the above-described current detection busbars 30A, 30B, 30C, 30D, and 30E, together with the magnetic core 10 and the Hall element 20, while keeping them from coming into contact with each other. However, in the case where the current detection busbars 30B, 30C, 30D, and 30E are employed, the insulating casing 40 has terminal portion through-holes 45 that are located at different locations or have a different shape than in the case of the current detection busbar 30.

<Current Detection Busbar (Sixth Modification)>

Figure 15:
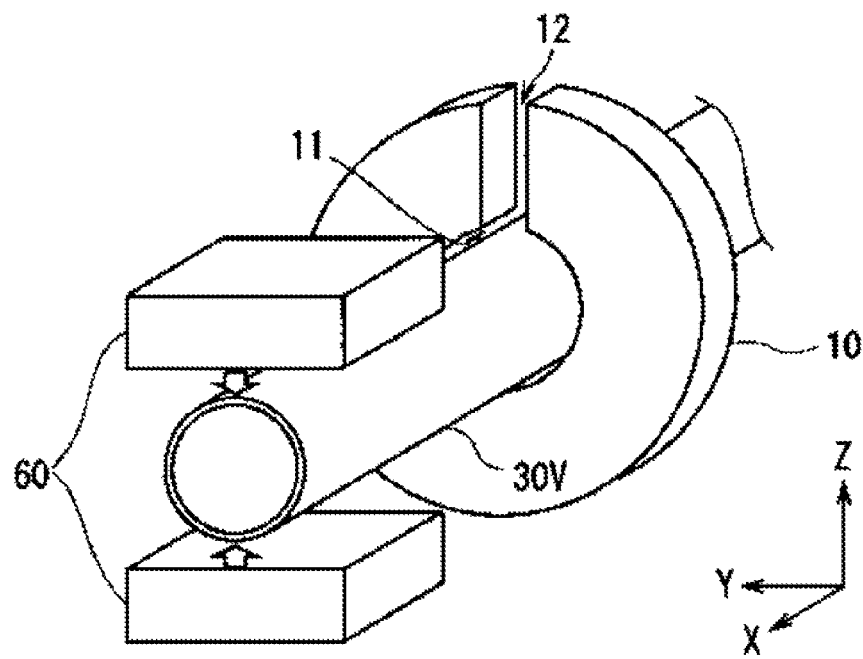
FIG. 15 shows a schematic perspective view of steps for manufacturing a current detection busbar according to a sixth modification that can be employed in the current detector 1.

Next, a current detection busbar according to a sixth modification that can be employed in the current detector 1 will be described with reference to FIG. 15. FIG. 15 is a schematic perspective view illustrating steps for manufacturing the current detection busbar according to the sixth modification. In FIG. 15, the same reference numerals are given to the same constituent components as those shown in FIGS. 1 to 3. Hereinafter, only differences between the current detection busbar according to the sixth modification and the current detection busbar 30 will be described.

The current detection busbar according to the sixth modification has a structure in which both end portions of the metal member 30V in the shape of a cylinder are processed, and has an external shape similar to that of the current detection busbar 30. The minimum width of the cross-sectional contour of the metal member 30V in the shape of a cylinder is configured to be larger than the gap height D2, which is a distance between both ends of the magnetic core 10. Since the metal member 30V shown in FIG. 15 is in the shape of a cylinder, the minimum width of the cross-sectional contour of the metal member 30V is the diameter of the metal member 30V.

To be more specific, the current detection busbar according to the sixth modification is a member that has a structure in which portions in a constant range at both ends of the metal member 30V in the shape of a cylinder that penetrates the hole portion 11 of the magnetic core 10 are pressed by press working using the pressing machine 60 and the like to the shape of flat plates. At that time, at least one end of the metal member 30V in the shape of a cylinder is pressed by press working to the shape of a flat plate after the metal member 30V in the shape of a cylinder has been inserted into the hole portion 11 of the magnetic core 10.

The two end portions that were pressed to the shape of flat plates serve as the flat plate-like terminal portions 32a of the current detection busbar according to the sixth modification, and the cylinder-shaped portion therebetween serves as the penetrating portion 31 of the current detection busbar according to the sixth modification.

Note that, similar to the current detection busbar 30, the insulating casing 40 holds the current detection busbar according to the sixth modification, together with the magnetic core 10 and the Hall element 20, while keeping them from coming into contact with each other.

The metal member 30V shown in FIG. 15 is a member in the shape of a cylinder, and the penetrating portion 31 of the current detection busbar manufactured by such processing of the both ends of the metal member 30V is in the shape of a cylinder. Note that the metal member 30V in the shape of a cylinder may be in the shape of an ellipsoidal cylinder whose cross-section is an ellipse or a square tube whose cross-section is a rectangle. Also, the metal member 30V in the shape of a cylinder may be in the shape of a cylinder whose cross-section is polygon except for a quadrangle.

It is preferable that the cross-sectional shape of the metal member 30V, that is, the cross-sectional shape of the penetrating portion 31 of the current detection busbar according to the sixth modification be similar to the contour shape of the hole portion 11 of the magnetic core 10. Even in the case where, in the current detector 1, the current detection busbar 30E as shown in FIG. 14 is employed instead of the current detection busbar 30, the same effect can be obtained as in the case where the current detection busbar 30 is employed.

<Other Configurations>

A configuration is also possible in which in the current detection busbar of the current detector 1, the terminal portion 32a in the shape of a flat plate shown in FIG. 1 or 11 is employed as one of the terminal portions 32, and the large-diameter terminal portion 32b shown in FIG. 12 or 14 is employed as the other terminal portion 32.

The invention claimed is:

1. A current detector for detecting a current that flows through a busbar, comprising:
    a magnetic core configured to be molded by sintering powder made from a magnetic material,
        the magnetic core having at least two ends facing each other across a gap portion, and
        the magnetic core being formed in one piece so as to surround a hole portion;
    a magneto-electric conversion element being disposed in the gap portion of the magnetic core and detecting a magnetic flux that changes in accordance with a current that passes through the hole portion of the magnetic core; and
    a current detection busbar made of a conductor;
        the current detection busbar including a penetrating portion that penetrates the hole portion of the magnetic core and terminal portions that are in connection with the penetrating portion on both sides in a direction in which the penetrating portion penetrates the hole portion;
        the terminal portions being configured to be joined with an upstream connection end and a downstream connection end respectively of a current transmission path,
        a width of the terminal portion being larger than a width of the hole portion,
    wherein at least one of the terminal portions of the current detection busbar is in a shape of a flat plate, and a minimum width of a cross-sectional contour of the penetrating portion is configured to be larger than a thickness of the terminal portion in the shape of the flat plate.

2. The current detector according to claim 1,
    wherein the penetrating portion of the current detection busbar has a cross-sectional shape that is homothetically similar to a contour shape of the hole portion of the magnetic core.

3. The current detector according to claim 1,
    wherein the current detection busbar is a member in which the minimum width of the cross-sectional contour thereof is configured to be larger than a distance between the two ends of the magnetic core, and
    at least one of two end portions of the metal member that penetrates the hole portion of the magnetic core is pressed by press working to the shape of a flat plate that has a larger width than other portions, the portion that was pressed to a shape of a flat plate serving as the terminal portion.

4. The current detector according to claim 1,
    wherein the minimum width of the cross-sectional contour of the current detection busbar is configured to be larger than the distance between the at least two ends of the magnetic core, and
    the current detection busbar has a structure in which at least one of two end portions of the current detection busbar in the shape of a rod that penetrates the hole portion of the magnetic core is processed by upset processing so as to be thicker than other portions, the portion that was processed so as to be thicker serving as the terminal portion.

5. The current detector according to claim 1,
    wherein the current detection busbar is a metal member that has a structure in which part of the metal member in the shape of a flat plate is folded along slits that are formed on both sides of the flat plate, the folded portion serving as the penetrating portion and the portions in the shape of flat plates on both sides of the folded portion serving as the terminal portions.

6. The current detector according to claim 5,
    wherein in the current detection busbar, the minimum width of the cross-sectional contour of the folded portion is configured to be larger than the distance between the at least two ends of the magnetic core, and the folded portion is formed at a position that is shifted towards one end in the width direction of the terminal portion.

7. The current detector according to claim 1, further comprising:
    an insulating casing made from an insulating material,
        the insulating casing being configured to cover the magnetic core, the penetrating portion of the current detection busbar, and the magneto-electric conversion element in a state where the terminal portions of the current detection busbar and a connector that is electrically connected to the magneto-electric conversion element are exposed to the outside, and the insulating casing being configured to hold the magnetic core, the current detection busbar that penetrates the hole portion, and the magneto-electric conversion element that is disposed in the gap portion, while keeping them from coming into contact with each other.

8. A current detector for detecting a current that flows through a busbar, comprising:
- a magnetic core having at least two ends facing each other across a gap portion,
  the magnetic core surrounding a hole portion;
- a magneto-electric conversion element being disposed in the gap portion of the magnetic core and detecting a magnetic flux that changes in accordance with a current that passes through the hole portion of the magnetic core; and
- a current detection busbar made of a conductor;
  - the current detection busbar including a penetrating portion that penetrates the hole portion of the magnetic core and terminal portions that are in connection with the penetrating portion on both sides in a direction in which the penetrating portion penetrates the hole portion;
  - a width of the terminal portion being larger than a width of the hole portion, and
  - the terminal portions being formed along two planes that intersect with each other,
  - wherein at least one of the terminal portions of the current detection busbar is in a shape of a flat plate, and a minimum width of a cross-sectional contour of the penetrating portion is configured to be larger than a thickness of the terminal portion in the shape of the flat plate.

9. The current detector according to claim 8, wherein the terminal portions being formed along two planes that are substantially perpendicular to each other.

10. A method of manufacturing a current detector for detecting a current that flows through a busbar, the current detector having a magnetic core having at least two ends facing each other across a gap portion, the magnetic core surrounding a hole portion, a magneto-electric conversion element being disposed in the gap portion of the magnetic core and detecting a magnetic flux that changes in accordance with a current that passes through the hole portion of the magnetic core; and a conductor member having a first end, middle portion, and a second end, the method comprising:
- passing the conductor member through the hole portion of the magnetic core,
- pressing the first end of the conductor member such that a width of the first end is larger than a width of the middle portion, and
- pressing the second end of the conductor member such that a width of the second end is larger than the width of the middle portion, wherein
- each of the width of the first end and the width of the second end is larger than a width of the hole portion, and
- at least one of the first end and the second end of the conductor member is in a shape of a flat plate, and a minimum width of a cross-sectional contour of the middle portion is configured to be larger than a thickness of the at least one of the first end and the second end of the conductor member in the shape of the flat plate.

* * * * *